(12) United States Patent
Gramann et al.

(10) Patent No.: US 7,782,627 B2
(45) Date of Patent: Aug. 24, 2010

(54) CONTROL DEVICE

(75) Inventors: Matthias Gramann, Renchen (DE); Juergen Henniger, Erlangen-Dechsendorf (DE); Matthias Wieczorek, Neunkirchen (DE); Peter Guth, Nuremberg (DE)

(73) Assignee: Conti Temic microelectronic, Nuremberg (DE)

( * ) Notice: Subject to any disclaimer, the term of this patent is extended or adjusted under 35 U.S.C. 154(b) by 494 days.

(21) Appl. No.: 11/918,586

(22) PCT Filed: Apr. 10, 2006

(86) PCT No.: PCT/DE2006/000630
§ 371 (c)(1),
(2), (4) Date: Oct. 15, 2007

(87) PCT Pub. No.: WO2006/108392
PCT Pub. Date: Oct. 19, 2006

(65) Prior Publication Data
US 2009/0122501 A1    May 14, 2009

(30) Foreign Application Priority Data
Apr. 15, 2005   (DE) .................. 10 2005 017 656

(51) Int. Cl.
*H05K 5/00* (2006.01)
(52) U.S. Cl. ....................... 361/752; 361/800
(58) Field of Classification Search ............. 361/752, 361/790, 797, 800; 312/223.1, 223.2
See application file for complete search history.

(56) References Cited

U.S. PATENT DOCUMENTS

| 5,466,055 | A | 11/1995 | Schmitt et al. |
| 6,160,708 | A | 12/2000 | Loibl et al. |
| 6,250,724 | B1 * | 6/2001 | Shimizu et al. .......... 303/119.2 |
| 6,300,565 | B1 | 10/2001 | Loibl et al. |
| 6,302,190 | B1 * | 10/2001 | Clamp et al. ................ 165/80.4 |
| 6,530,856 | B1 * | 3/2003 | Kakiage ...................... 475/123 |
| 7,073,410 | B2 * | 7/2006 | Albert ....................... 74/606 R |

FOREIGN PATENT DOCUMENTS

| DE | 196 06 481 | 3/1997 |
| DE | 197 12 842 | 3/1997 |
| EP | 1 239 710 | 9/2002 |

* cited by examiner

*Primary Examiner*—Hung S Bui
(74) *Attorney, Agent, or Firm*—W. F. Fasse; W. G. Fasse

(57) ABSTRACT

A control device for arrangement in a fluid environment includes a housing, with a housing lid (1) for accommodating sensors and a housing shell (2) for receiving at least one control unit (3). The control device further includes at least one device (4) for electrically connecting the sensors to the control unit (3) as well as at least one sealing element (5) for sealing the housing shell (2) against the fluid environment. The device (4) for electrically connecting the sensors located on the housing lid (1) to the control unit (3) in the housing shell (2) is embodied as a film conductor between the housing lid (1) and the sealing element (5) while the sealing element (5) is embodied as a plane sealing element.

13 Claims, 2 Drawing Sheets

CONTROL DEVICE

FIELD OF THE INVENTION

The invention relates to a control device in a fluid environment.

BACKGROUND INFORMATION

With conventional control devices, as they are used for example in transmissions of motor vehicle engines, the sensor supports on the housing lid cannot be mounted, as the lid usually is not stable and does not allow for a reliable positioning of the sensor supports in the Z-direction in case of pressure fluctuations in the control device. Therefore, the sensor supports are preferably positioned outside of the lid on a separate plastic housing, with the further disadvantage that in case of thermal fluctuations by the different coefficients of expansion of plastic housing and housing shell, usually made of aluminum or gray cast iron, the accuracy of the positioning of the sensor supports in the X-Y level diminishes. In addition, thereby, the necessary installation space becomes relatively large and the customer's request that the parts to be sensored by the sensors are to be located in the projection level of the lid cannot be met.

A control device of this type is known from DE 197 12 842 C1. A preferred field of application of this control device is the integration of a control electronics into an automatic transmission for realizing a fully integrated transmission control. The control device comprises a base plate and a housing lid. On the base plate a control electronics is arranged and a seal circulating at the housing lid serves for sealing the control device against the surrounding transmission oil. Moreover, the housing lid is formed as a body for electrical conductors, sensors and plug connectors. These components are located outside of the cavity formed in the housing lid for accommodating the control electronics. For electrically connecting the control electronics on the base plate to the mentioned external components, the electrical conductors, for example leadframes, are co-injected in the production of the housing lid. A control device of this type causes high manufacturing costs, needs a large installation space and after fixing of the electrical conductors in the housing lid is restricted to a defined application.

SUMMARY OF THE INVENTION

Based on this, it is the object of the present invention to create a control device which takes a small installation space and by its modular structure is flexibly applicable and thus contributes to reduce the manufacturing costs.

This object is solved according to the invention by a control device with the features set forth herein.

The control device is in a fluid environment and comprises a housing with a housing lid for accommodating sensors and a housing shell for receiving at least one control unit. For electrically connecting the sensors to the control unit at least one film conductor is provided, which is arranged between the housing lid and a sealing element. The sealing element is embodied in plane manner and contrary to a circulating seal seals the housing shell over the entire surface of the housing shell against the fluid environment.

Based to the fact that the sensors on the housing lid are electrically connected to the control unit in the housing shell by means of a film conductor, for example in the pilot series phase very fast reaction to a change in the arrangement of the sensors on the housing lid is possible. Merely the form of the film conductor must be adapted. The plane sealing element seals the housing shell over the whole surface against the surrounding fluid and has the advantage that the housing lid must not fulfill a sealing function and thus is as far as possible independent in its shaping of the outline of the housing shell. This modular structure of the control device implicates that it is possible to use the control device with different internal combustion engines by simply applying another housing lid with an adapted sensor arrangement and film conductor form.

Use of a one-piece film conductor permits simple wiring and facilitates handling during assembly, since only one part is used.

The same advantages in relation to the handling during assembly result in the embodiment of the plane sealing element from one piece. Preferably, the plane sealing element is flexibly embodied. Thus, with the occurrence of even extreme thermal fluctuations in the control device arising pressure fluctuations can be compensated without impairing the sealing function.

The supports of the sensors are arranged on the side of the housing lid facing away from the housing shell; in particular in such a manner that they can receive also signals from engine components, such as for example transmission gear wheels, which are located outside of the control device in a region, which is within the projection level of control electronics.

In order to keep the expenditure for sealing as small as possible, preferably only that part of the housing shell, which accommodates at least one control unit, is sealed against the fluid environment. In particular, in the housing shell in this special region in addition a circulating seal is provided.

Advantageously, the housing lid and the housing shell are made of the same material, for example of aluminum or gray cast-iron. If different materials are used the linear expansion of the two parts caused by the different coefficients of expansion would not allow for an accurate positioning of the sensors in case of thermal fluctuations.

In order to prevent sinking of the plane sealing element and connected thereto contacting of the control electronics or any other electronic components by the sealing element in case of negative pressure in the housing shell, caused by a change of temperature in the fluid environment, the sealing element is connected to the housing lid in at least selectively force- and/or form-fit manner. This selective connection can be managed by interlocking or caulking of the sealing element in the housing lid.

The plane sealing element comprises domes, which protrude through break-throughs in the film conductor into appropriate recesses in the housing lid. Thus, simple guidance and fixing of the film conductor between the plane seal and the housing lid is ensured. It would be also conceivable that the domes are arranged at the housing lid and protrude into appropriate recesses in the plane sealing element.

BRIEF DESCRIPTION OF THE DRAWINGS

In the ensuing description advantageous features and details of the invention taken in conjunction with the drawings are further explained on the basis of examples of embodiments. Here, described features and connections described in individual variants are in principle transferable to all examples of embodiment. The drawings show.

DETAILED DESCRIPTION OF AN EXAMPLE EMBODIMENT OF THE INVENTION

Figure 1:
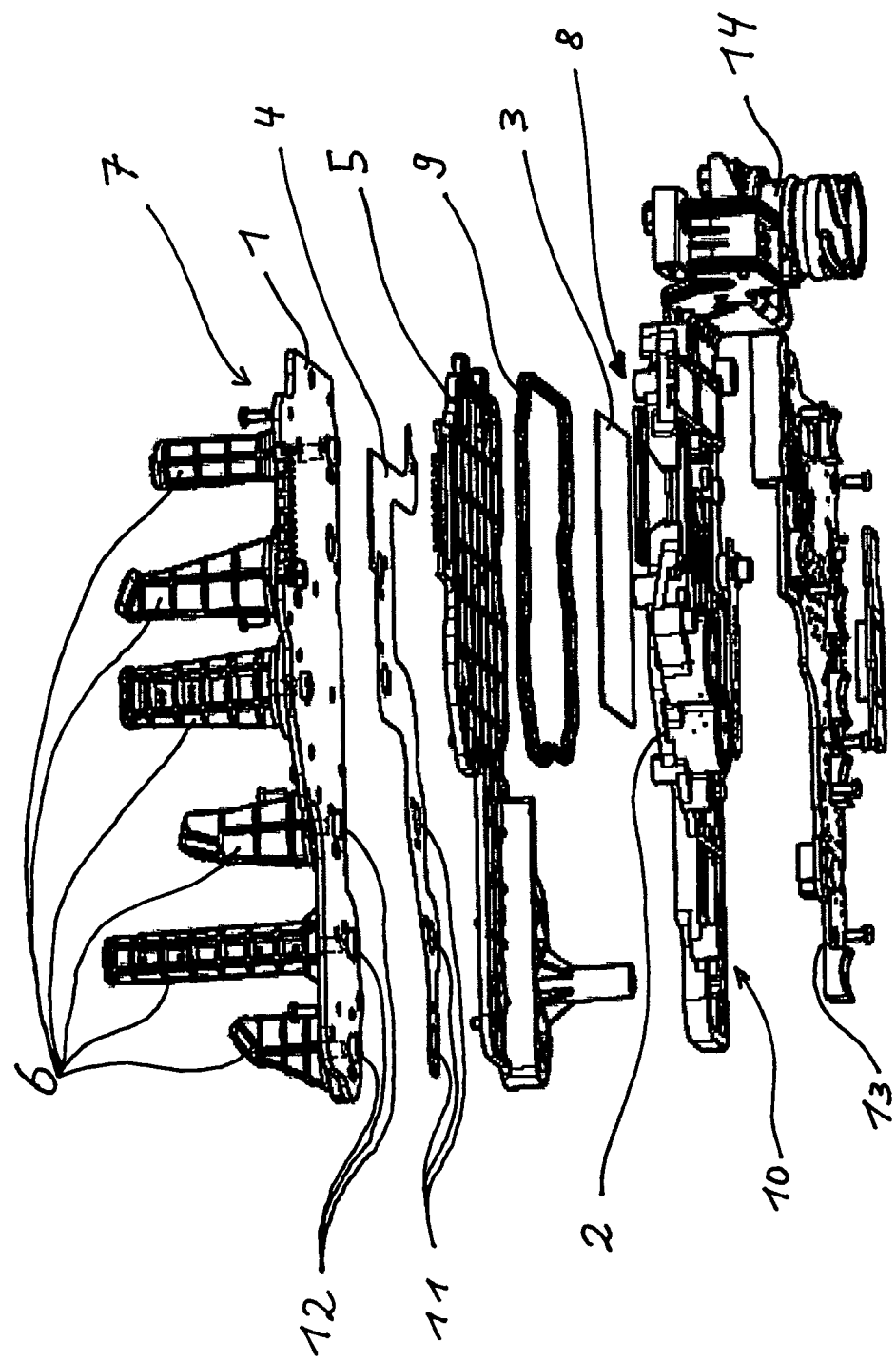
FIG. 1 a control device with detached valve contacting in an explosive view

FIG. 1 shows a control device as it is used for example for controlling actuators in motor vehicle transmissions. The control device is completely or only partially in the transmission oil and comprises a housing lid 1 and a housing shell 2. During operation the control device is exposed to thermal fluctuations in a range from approx. −40° C. to +150° C. Further unfavorable external influences are above all pressure fluctuations caused by changes in temperature within and outside of the control device, mechanical forces by oil flowing around and vibrations, which are caused in particular by the engine.

On the side 7 of the housing lid 1 facing away from the housing shell 2 the supports 6 for the sensors are arranged depending on the position of the transmission components to be sensed. The transmission components to be sensed are for example transmission gear wheels, which RPM is to be determined, or also shift forks for determining the regulating steps. The sensor supports 6 shown in FIG. 1 are columnar formations made of plastics. They are preferably screw connected from the side opposite to the sensor supports 6 to the housing lid 1 by means of corresponding openings, which are not shown, in the housing lid 1.

The sensors are located very precisely fitting in the appropriate sensor supports 6. The housing lid 1, as a basis for the sensor supports 6, must ensure in particular their exact positioning in X-, Y- and Z-direction. Therefore, the housing lid 1 is in particular embodied as a rigid, stable plate, preferably made of aluminum or steel. The advantages in relation to a die-cast part are furthermore the low material and manufacturing costs. The housing lid 1 is such stable that fluctuations in pressure and temperature, respectively, do not result in a change of position of the sensor supports 6. For example, pressure fluctuations in the housing of −400 mbar up to +700 mbar around the normal pressure can be absorbed without negative influences on the position of the sensor supports 6.

For example, a leadframe injected into the sensor supports 6 serves as an electrical contacting of the sensors through the housing lid 1. At the end of the sensor support 6 opposite to the sensor the leadframe protrudes so far from the sensor support 6 that after the electrically insulating leading of the leadframe through the appropriate opening in the housing lid 1 a contacting of the leadframe is possible from the side of the housing shell. The leading-through of the contacting must not be implemented in oil-tight manner. The leadframe is not shown in detail in FIG. 1.

A continuous, one-piece film conductor 4 serves for electrically connecting the sensors to the control unit 3 in the housing shell 2. Also individual foil strips arranged depending on the location of the sensor supports 6 are conceivable. In order to save material, the form of the film conductor 4 is adapted to the arrangement of the sensor supports 6. If, for example, in the development phase of the transmission the position of the transmission components to be sensed changes, then without large time lag the arrangement of the sensor supports 6 and accordingly the form of the film conductor 4 can be adapted. It would also be conceivable to use the same control unit in different transmission versions. Besides, the film conductor 4 is resistant to the aggressive transmission oil. The film conductor 4 is preferably laminated upon the housing lid 1.

In the entire range of temperature and pressure fluctuation without an additional pressure balance device the housing shell 2 with the control unit 3 is sealed over the whole surface against the transmission oil by a plane sealing element 5 made of plastics. The plane sealing element 5 preferably consists of one piece. The plastics can be for example a cross-linked polymer. The plane sealing element 5 is arranged between the housing lid 1 and the housing shell 2 such that the tolerance in the dimension of the control device is not affected in direction of the longitudinal axis of the sensor supports.

The film conductor 4 is arranged between the housing lid 1 and the plane sealing element 5. If the film conductor 4 is not plane connected with the housing lid 1, then, as is shown in FIG. 1, it can for example be guided through it and can be fixed by the domes 12, which are arranged at the housing lid 1, being introduced through appropriate breakthroughs 11 in the film conductor 4 into appropriate recesses in the plane sealing element 5. It would be also conceivable that the domes on the plane sealing element 5 and the appropriate recesses are arranged on the housing lid 1. By means of this arrangement the film conductor 4 is kept stable with regard to its position above all also against dynamic oil forces occurring during operation. A further advantage of the plane sealing element 5 is that the housing lid 1 itself must not have a sealing function.

The plane sealing element 5 can be implemented in particular as a flexible membrane. Thus, also larger pressure fluctuations in the housing shell 2 can be compensated without impairing the sealing function. In case of negative pressure in the housing shell 2 a sinking of the membrane 5 and with it a possible contacting of components or electronic connections, such as bond wires, on the control unit 3 in the housing shell 2 or even their damage, is prevented in that the membrane 5 with the housing lid 1 is connected in at least selectively force- and/or form-fit manner. This can be effected for example by interlocking or caulking of the membrane 5 in the housing lid 1. In case of positive pressure in the housing shell 2 the membrane 5 is pressed against the housing lid 1 and thus an extension of the membrane 5 negatively affecting the sealing function is avoided.

Under extreme conditions it may be necessary that the part 8 of the housing shell 2, which accommodates the control unit 3, is sealed by an additional, circulating seal 9 against the fluid environment. The material from which this seal 9 is manufactured, can be for example a cross-linked polymer.

FIG. 1 shows that the housing shell 2 essentially comprises the part 8, which accommodates the control unit 3, and which comprises the part 10. The part 10 of the housing shell 2 in particular has an assembly function. The control device is fixed in particular by means of this part 10 for example to the transmission. The housing lid 1 and the plane sealing element 5 essentially have the same plane expansions as the housing shell 2. However, it is also conceivable to dimension the plane sealing element 5 smaller and that for example such that it seals only the part 8 of the housing shell 2 with the control unit 3.

The form of the housing lid 1 depends above all on the position of the sensor supports 6. For example, if the sensor supports 6 are only in the region of the projection level of the part 8, then the lid 1 can be also embodied in material-saving manner accordingly limited to this region.

FIG. 1 shows additionally the valve contacting 13 in its unmounted condition. It is preferably connected by screwing to the housing shell 2. Via the plug 14 the electrical connection between the control unit 3 and the engine periphery is effected, such as for example the engine control device. The plug 14 is connected in force- or form-fit manner to the housing shell 2.

Figure 2:
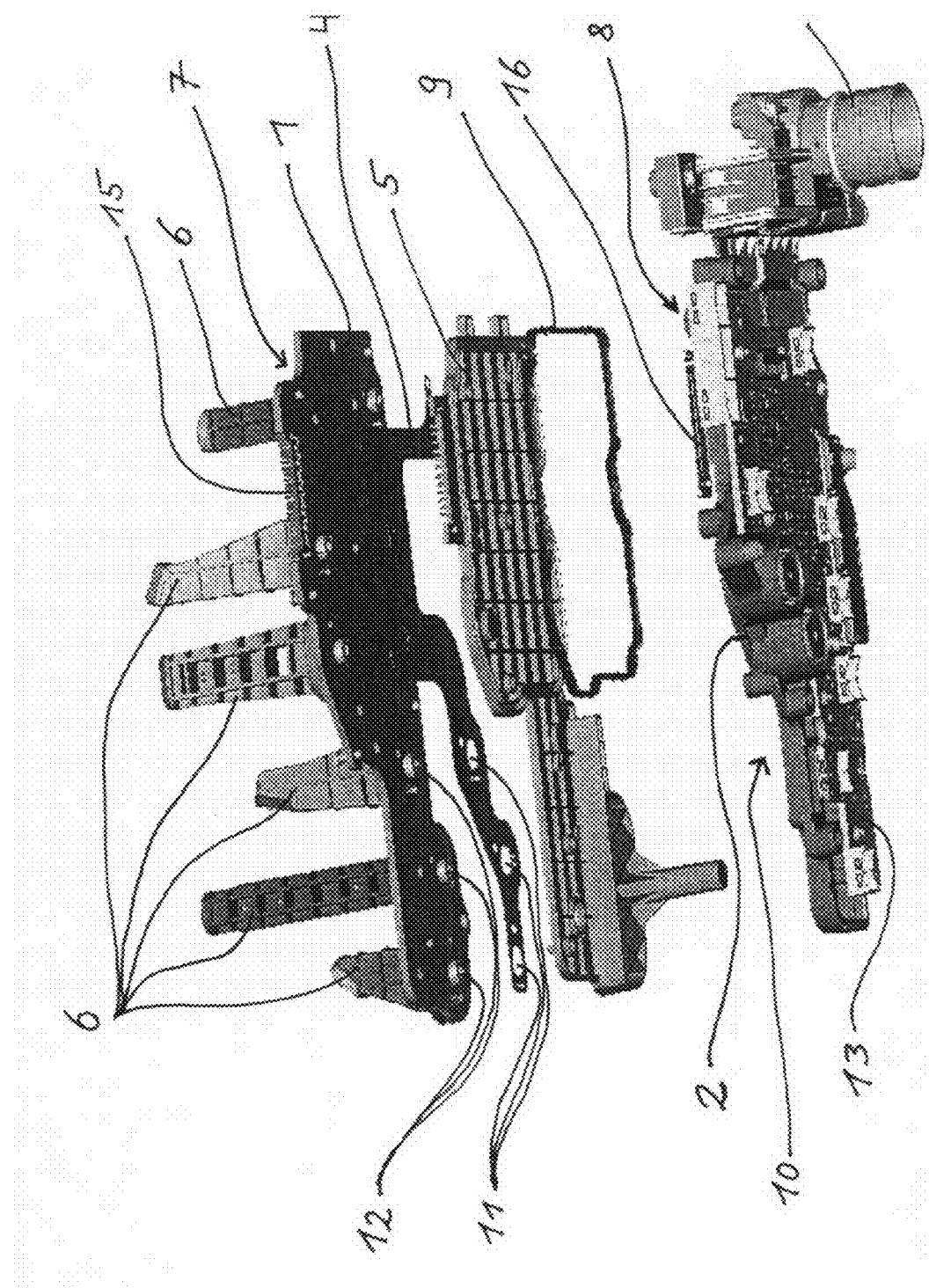
FIG. 2 a control device with integrated valve contacting in an explosive view

FIG. 2 shows the control device as in FIG. 1, this time only with a valve contacting 13 integrated at the housing lid 2 and a control unit 3 already fit into the housing shell 2. The first interface 15 shown in FIG. 2 is connected in force- and form-fit manner to the housing lid 1. It serves for electrically connecting the film conductor 4 to a further film conductor, which is not shown in this drawing. Based on the first interface 15 at the housing lid 1 this further film conductor runs outside of the part 8 to be sealed of the housing shell to the second interface 16. This second interface 16, for example, is electrically connected to the control unit 3 in sealing manner through the housing shell 2. The electrical connection of the first and the second interface 15 and 16, respectively, to the further film conductor can be effected, for example, by soldering and/or by force-fitting contacting. If a replacement of the housing lid 2 is necessary, for example due to a changed position of the sensor supports 6, merely the connection between the interface 15 and the further film conductor must be released. This is a further advantage of the modular structure of this control device.

The present control device, which is distinguished particularly by its stability, by its modular structure and its compactness, can be manufactured economically and is flexibly applicable. The housing lid has no sealing function. Thus, for the same housing shell with control unit the housing lid with the sensor supports and the corresponding film conductor can be adapted to different transmissions.

LIST OF REFERENCE NUMERALS

1 Housing lid
2 Housing shell
3 Control unit
4 Film conductor
5 Plane sealing element
6 Sensor supports
7 Top side of the housing lid
8 Part of the housing shell, which accommodates the control unit
9 Circulating seal
10 Part of the housing shell serving the assembly
11 Break-through in the film conductor
12 Dome in the housing lid
13 Valve contacting
14 Plug
15 First interface, at the housing lid
16 Second interface, at the control unit

The invention claimed is:

1. A control device in a fluid environment with a housing, comprising a housing lid (1) for accommodating sensors and a housing shell (2) for receiving at least one control unit (3), with at least one device (4) for electrically connecting the sensors to the control unit and with at least one sealing element (5) for sealing the housing shell (2) against the fluid environment, characterized in that
the device (4) for electrically connecting the sensors on the housing lid (1) to the control unit (3) in the housing shell (2) is embodied as a film conductor between the housing lid (1) and the sealing element (5) and in that the sealing element (5) is embodied as a plane sealing element.

2. The control device according to claim 1, characterized in that the film conductor (4) is embodied as a continuous film conductor.

3. The control device according to claim 1, characterized in that the plane sealing element (5) is embodied in one piece.

4. The control device according to claim 1, characterized in that the plane sealing element (5) is embodied flexibly.

5. The control device according to claim 1, further comprising supports (6) that support the sensors and that are arranged on a side (7) of the housing lid (1) facing away from the housing shell (2).

6. The control device according to claim 1, characterized in that a part (8) of the housing shell (2), which accommodates the at least one control unit (3), is sealed against the fluid environment.

7. The control device according to claim 6, characterized in that the part (8) of the housing shell (2), which accommodates the at least one control unit (3), is sealed against the fluid environment with a circulating seal (9).

8. The control device according to claim 1, characterized in that the housing lid (1) and the housing shell (2) are made of the same material.

9. The control device according to claim 1, characterized in that the housing lid (1) and the housing shell (2) are made of aluminum, steel sheet or gray cast iron.

10. The control device according to claim 1, characterized in that the plane sealing element (5) is connected in at least a selectively force-fit and/or form-fit manner to the housing lid (1).

11. The control device according to claim 10, characterized in that the plane sealing element (5) is at least selectively connected to the housing lid (1) by interlocking or caulking.

12. The control device according to claim 1, characterized in that the plane sealing element (5) comprises domes, which protrude through break-throughs (11) in the film conductor (4) into appropriate recesses in the housing lid (1).

13. The control device according to claim 1, characterized in that the housing lid (1) comprises domes (12), which protrude through break-throughs (11) in the film conductor (4) into appropriate recesses in the plane sealing element (5).

* * * * *